United States Patent [19]

Galbraith

[11] Patent Number: 4,871,978

[45] Date of Patent: Oct. 3, 1989

[54] HIGH-SPEED STATIC DIFFERENTIAL SENSE AMPLIFIER

[75] Inventor: Douglas C. Galbraith, Fremont, Calif.

[73] Assignee: Actel Corporation, Sunnyvale, Calif.

[21] Appl. No.: 230,762

[22] Filed: Aug. 10, 1988

[51] Int. Cl.$^4$ .......................... H03F 3/45; G11C 7/06
[52] U.S. Cl. .................................... 330/253; 307/530; 330/257
[58] Field of Search .............. 307/494, 496, 497, 530; 330/252, 253, 257, 277

[56] References Cited

U.S. PATENT DOCUMENTS 4,653,029  3/1987  Sato ................................ 307/530 X Primary Examiner—Steven Mottola
Attorney, Agent, or Firm—Lyon & Lyon

[57] ABSTRACT

The high-speed static differential sense amplifier of the present invention is composed of two stages. The first stage uses a source follower to feed a set of dual complimentary current mirrors. The current mirrors in the source of the input devices convert the voltage difference supplied by the source follower into a current. This current is mirrored into the second stage by opposing pull-down and pull-up current mirrors from the first stage. The second stage current difference produces the large voltage swings needed to drive the digital logic.

2 Claims, 1 Drawing Sheet

HIGH-SPEED STATIC DIFFERENTIAL SENSE AMPLIFIER

BACKGROUND OF THE INVENTION

1. Field Of The Invention

The present invention relates to integrated circuits and electronic circuits within integrated circuits used as sense amplifiers which find application in random access memory, programmable read-only memory, and read-only memory to detect the presence or absence of an active memory signal. More particularly, the present invention is a high-speed static differential sense amplifier.

2. The Prior Art

The conventional voltage sensing static differential sense amplifier contains two data paths. Each data path has four branches divided into two stages. The two data paths are used to maintain a differential signal through the amplification chain. Maintaining a differential signal improves the noise margin by rejecting the common mode noise. Each stage uses two branches to double their effective input voltage, and thereby more than double their single-ended output voltage. To maintain a differential signal, a complimentary stage is necessary to produce a matching signal with the opposite polarity.

The conventional differential sense amplifier is relatively slow due to the large number of branches required to maintain a differential signal. For example, in the conventional design there are four branch delays between the input and the output. Some dynamic sense amplifiers have only two branch delays. The conventional static differential sense amplifier design is inherently slower then the dynamic differential sense amplifier.

The conventional static differential sense amplifier also uses a large amount of current. There are eight branches consuming eight separate bias currents. If this sense amplifier were used in an eight output product there would be 64 separate branches consuming DC current. For products having multiple outputs, the output drive current of each branch must be sacrificed to control the current consumption which usually makes the sense amplifier slower since there is less current available to drive the load. One solution to this is to add another logic stage to regain the lost drive. However, adding such a stage only adds another delay and makes the product even slower.

BRIEF DESCRIPTION OF THE INVENTION

The high-speed static differential sense amplifier of the present invention is composed of two stages. The first stage uses a source follower to feed a set of dual complimentary current mirrors. The current mirrors in the source of the input devices convert the voltage difference supplied by the source follower into a current. This current is mirrored into the second stage by opposing pull-down and pull-up current mirrors from the first stage. The second stage current difference produces the large voltage swings needed to drive the digital logic.

The high-speed static differential sense amplifier of the present invention maintains the differential signal by using two current mirrors per branch to create complimentary signals. One mirror generates a positive signal from the branch current, while the other mirror generates a negative signal from the same branch current. As a result, it needs only half as many branches to obtain the same amount of amplification as a conventional sense amplifier. Furthermore, the high-speed static sense amplifier of the present invention has only two branch delays between the input and the output and it only has four branches consuming DC bias current. With half the branch delay and half the bias current for the same gain, the present invention has four times the speed power product as the conventional static differential sense amplifier. The cross coupled current mirrors in the input stage of the differential sense amplifier of the present invention provide a voltage to current gain of up to two, typically between 1.5 to 2.0. It enhances the total amplifier gain such that an additional stage of amplification, with its associated delay and power consumption, is unnecessary.

DETAILED DESCRIPTION OF A PREFERRED EMBODIMENT

Figure 1:
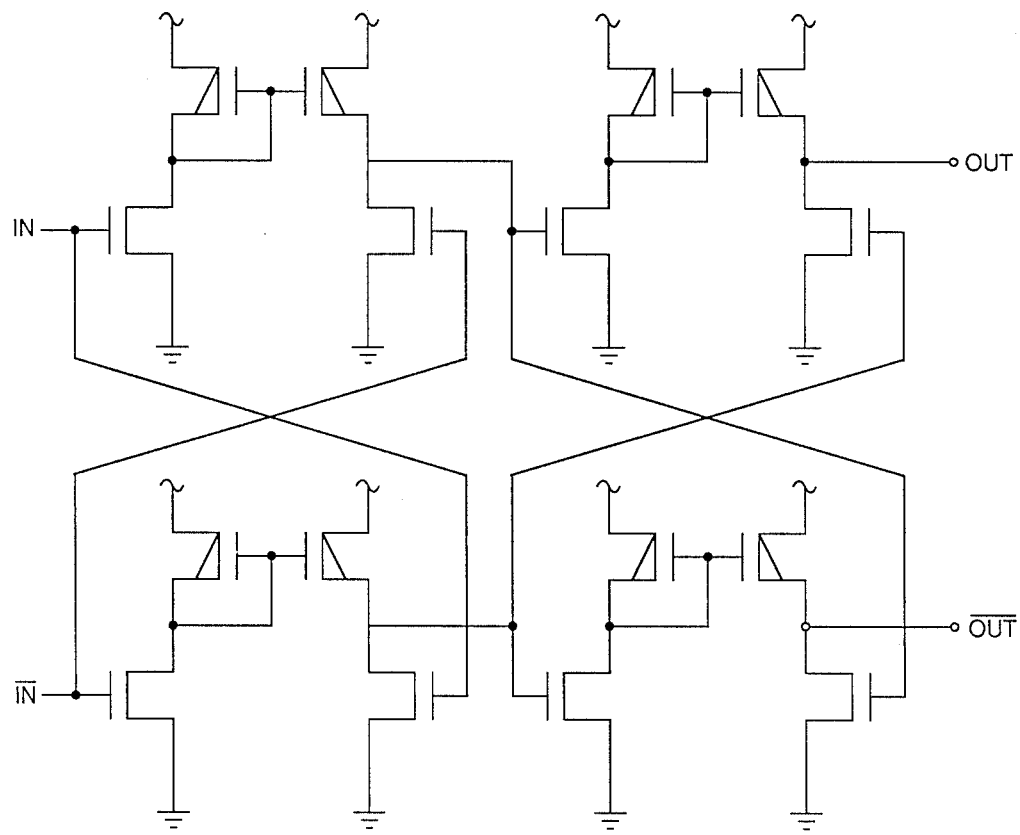
FIG. 1 is a schematic diagram of a typical prior art differential sense amplifier.
Figure 2:
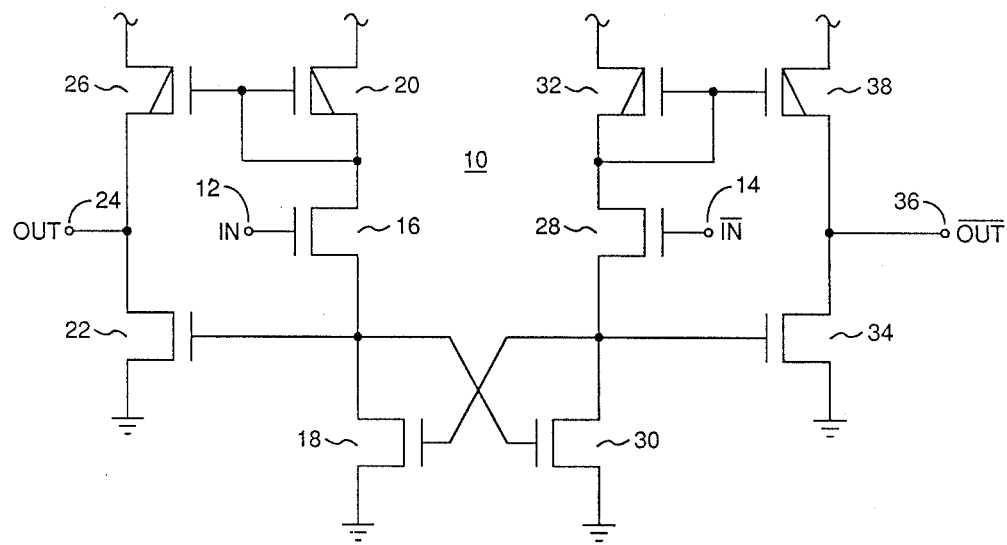
FIG. 2 is a schematic diagram of a presently preferred embodiment of a high speed differential sense amplifier according to the present invention.

Referring now to FIG. 2, a schematic diagram of a preferred embodiment of the differential sense amplifier of the present invention, has a first input node 12 and a second complimentary input node 14. Input node 12 is connected to the gate of emitter follower transistor 16. The source of emitter follower transistor 16 is connected to the drain of first cross coupled transistor 18. The source of first cross coupled transistor 18 is connected to a source of negative voltage Vss. The drain of first source follower transistor 16 is connected to the gate and drain of first P-channel transistor 20. The source of first P-channel transistor 20 is connected to a source of positive voltage Vdd. The source of first source follower transistor 16 is connected to the gate of first N-channel mirror transistor 22. The source of first N-channel mirror transistor 22 is connected to Vss. The drain of first N-channel mirror transistor 22 is connected to output node 24. A second P-channel transistor 26 has its source connected to Vdd, its drain connected to output node 24, and its gate connected to the first P-channel transistor 20.

Complimentary input node 14 is connected to the gate of second source follower transistor 28. The source of second source follower transistor 28 is connected to the drain of second cross coupled transistor 30. The source of second cross coupled transistor 30 is connected to ground. The gate of second cross coupled transistor 30 is connected to the drain of first cross coupled transistor 18. The gate of first cross coupled transistor 18 is connected to the drain of second cross coupled transistor 30. The drain of second source follower transistor 38 is connected to the drain and gate of third P-channel transistor 32. The source of third P-channel transistor 32 is connected to Vdd. The source of second source follower transistor 28 is connected to the gate of second N-channel transistor 34. The source of second N-channel transistor 34 is connected to Vss. The drain of second N-channel transistor 34 is connected to output node 36. Fourth P-channel transistor 38 has its source connected to Vdd, its drain connected to output node 36 and its gate connected to the gate and drain of third P-channel transistor 32. First and second P-channel transistors form a first pull-up current mirror. Third and fourth P-channel transistors form a second pull-up current mirror. First cross coupled N-channel transistor 18 and second N-channel transistor 34 form a first pull-down current mirror and second cross coupled transistor 30 and first N-channel transistor 22 form a second pull-down current mirror.

The first stage of the amplifier of the present invention is composed of a source follower. N-channel transistor 16 and 28 are the input drivers for the source followers. Their inputs are voltages not currents. The input voltage is fed to the source devices 16 and the sources device 18, feeding a current mirror. This current mirror is cross-coupled, which allows a gain of greater than one to be achieved. A voltage-to-current conversion with a gain greater then 1 is obtained by using the nonlinearity of latch, composed of the cross-coupled current mirrors. Current which flows through the sources also flows through the drain of devices 16 and 18. Current which flows through the drains of devices 16 and 18 also flows through the drains of the P-channel current mirrors 20 and 32. This current is reflected over into the second branches comprising devices 26 and 38.

The output branches contain two sets of current mirrors. One set of current mirrors pulls up and one pulls down, i.e., P-channel device 26 is a pull-up and N-channel device is a pulldown, P-channel device 38 is a pull-up and N-channel device ia a pull-down. The current which flows in these output branches is the difference between the current which is flowing in device 16 and device 28. The output branches may provide amplification if the device sizes there for instance are twice the devices sizes of the input branches. If the devices are not ratioed i.e., if devices 18 and 20 were either one to one ratio, it would be desirable to have device 26 and 2 to be a one to one ratio. The cross-coupling of N-channel device 18 and 30 increases the total gain of the system which allows enough gain to get a full output swing, close to a rail to rail swing within the four branches without the addition of another stage.

What is claimed is:

1. A high-speed static differential sense amplifier, including:
   a noninverting input node,
   an inverting input node,
   a first source follower connected to said noninverting input node,
   a second source follower connected to said inverting node,
   a first current mirror connected to said first source follower and to said noninverting output,
   a second current mirror connected to said second source follower and to said inverting output,
   a third current mirror connected to said second source follower and said noninverting output,
   a fourth current mirror connected between said first source follower and said noninverting output.

2. A high-speed static differential sense amplifier, including:
   a noninverting input node,
   an inverting input node,
   a first N-channel input transistor having its gate connected to said noninverting input node,
   a second N-channel input transistor having its gate connected to said inverting input node,
   a third N-channel input transistor having its source connected to a source of negative voltage and its drain connected to the source of said first N-channel input transistor,
   a fourth N-channel input transistor having its source connected to a source of negative voltage, its gate connected to the drain of said third N-channel input transistor and its drain connected to the source of said second N-channel input transistor and to the gate of said third N-channel input transistor,
   a first P-channel input transistor having its source connected to a source of positive voltage, its drain and gate connected to the drain of said first N-channel input transistor,
   a second P-channel input transistor having its source connected to a source of positive voltage and its drain and gate connected to the drain of said second N-channel input transistor,
   a first N-channel output transistor having its source connected to a source of negative voltage, its gate connected to the source of said first N-channel input transistor and its drain connected to a noninverting output node,
   a first P-channel output transistor having its source connected to a source of positive voltage, its gate connected to the drain of said first N-channel input transistor and its drain connected to said noninverting output node,
   a second N-channel output transistor having its source connected to a source of negative voltage, its gate connected to the source of said second N-channel input transistor and its drain connected to an inverting output node,
   a second P-channel output transistor having its source connected to a source of negative voltage, its gate connected to the drain of said second N-channel input transistor and its drain connected to said inverting output node.

* * * * *